(12) United States Patent
Kim

(10) Patent No.: US 8,531,864 B2
(45) Date of Patent: Sep. 10, 2013

(54) NONVOLATILE SEMICONDUCTOR INTEGRATED CIRCUIT FOR CONTROLLING SENSING VOLTAGE

(75) Inventor: Dong Keun Kim, Incheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 368 days.

(21) Appl. No.: 12/844,637

(22) Filed: Jul. 27, 2010

(65) Prior Publication Data

US 2011/0157957 A1    Jun. 30, 2011

(30) Foreign Application Priority Data

Dec. 24, 2009    (KR) ........................ 10-2009-0130725

(51) Int. Cl.
*G11C 11/00*    (2006.01)
(52) U.S. Cl.
USPC ...................... 365/148; 365/189.11
(58) Field of Classification Search
USPC ............. 365/148, 158, 163, 171, 173, 189.11
See application file for complete search history.

(56) References Cited

U.S. PATENT DOCUMENTS

| | | | |
|---|---|---|---|
| 5,414,658 A | 5/1995 | Challa | |
| 6,219,273 B1 * | 4/2001 | Katti et al. | 365/158 |
| 6,891,768 B2 * | 5/2005 | Smith et al. | 365/207 |
| 6,954,392 B2 * | 10/2005 | Baker | 365/209 |
| 7,391,644 B2 * | 6/2008 | Cho et al. | 365/163 |
| 7,522,449 B2 | 4/2009 | Ro et al. | |
| 8,228,714 B2 * | 7/2012 | Davierwalla et al. | 365/158 |
| 2008/0074918 A1 | 3/2008 | Ro et al. | |
| 2008/0101111 A1 | 5/2008 | Chang | |
| 2009/0067227 A1 | 3/2009 | Kang et al. | |
| 2009/0296488 A1 | 12/2009 | Nguyen et al. | |

FOREIGN PATENT DOCUMENTS

| | | |
|---|---|---|
| JP | 2007-157317 | 6/2007 |
| JP | 2007157317 A * | 6/2007 |

* cited by examiner

*Primary Examiner* — Harry W Byrne
*Assistant Examiner* — Lance Reidlinger
(74) *Attorney, Agent, or Firm* — William Park & Associates Patent Ltd.

(57) ABSTRACT

A nonvolatile semiconductor integrated circuit includes a memory cell array configured to include each of memory cells having a variable resistor; a current sensing unit configured to convert a current which depends on the variable resistor of a corresponding memory cell, into a sensing voltage; and a voltage control unit configured to receive the sensing voltage for a predetermined time in response to a sensing control signal, regulate the received sensing voltage, and provide a sensing output voltage.

12 Claims, 3 Drawing Sheets

NONVOLATILE SEMICONDUCTOR INTEGRATED CIRCUIT FOR CONTROLLING SENSING VOLTAGE

CROSS-REFERENCES TO RELATED APPLICATION

The present application claims priority under 35 U.S.C. §119(a) to Korean application number 10-2009-0130725, filed on Dec. 24, 2009, in the Korean Intellectual Property Office, which is incorporated herein by reference in its entirety as set forth in full.

BACKGROUND

1. Technical Field

The present invention relates to a nonvolatile semiconductor memory circuit, and more particularly, to a nonvolatile semiconductor memory circuit for controlling a sensing voltage.

2. Related Art

In general, a unit memory cell of a phase change random access memory (PCRAM) includes one switching element which is connected to a word line, for example, one variable resistor (GST: germanium-antimony-tellurium) which is connected to a diode and a bit line. The PCRAM can store data in the memory cell by controlling the reversible phase change of the variable resistor (GST) using electrical pulses.

For example, if a pulse current is applied to the memory cell for a predetermined time, the state of the variable resistor (GST) can be established as an amorphous state (or a reset state). If the pulse current is applied to the memory cell for a time longer than the predetermined time, the state of the variable resistor (GST) can be established as a crystalline state (or a set state).

Such a PCRAM discriminates data by sensing an amount of current conforming to a change in resistance. For example, a current sense amplifier compares a sensing voltage, into which the amount of current is converted, with a reference voltage and discriminates data as "1" or "0".

In general, the current sense amplifier permits current flow using a voltage higher than the voltage of an internal circuit, for example, a voltage of a VPP level. However, since another circuit uses a voltage of a CMOS level lower than the voltage of the VPP level, for example, a voltage of a VPERI level, the sensing voltage should be converted into a voltage for use in the cell. Under this situation, the output voltage of the current sense amplifier is level-shifted to a predetermined level by using a reference voltage, such that a signal having a voltage level for use in the cell can be provided. While a cross-coupled type sense amplifier is generally used as a level shifting circuit for this purpose, since the cross-coupled type sense amplifier has a substantial footprint due to its inherent characteristics, difficulties are likely to be caused in terms of disposal and layout thereof.

SUMMARY

A nonvolatile semiconductor memory circuit having improved area efficiency is described herein.

In one embodiment of the present invention, a nonvolatile semiconductor integrated circuit comprises a memory cell array configured to include each of memory cells having a variable resistor; a current sensing unit configured to convert a current which depends on the variable resistor of a corresponding memory cell, into a sensing voltage; and a voltage control unit configured to receive the sensing voltage for a predetermined time in response to a sensing control signal, regulate the received sensing voltage, and provide a sensing output voltage.

In another embodiment of the present invention, a nonvolatile semiconductor integrated circuit comprises a memory cell array configured to include each of memory cells having a variable resistor; a current sensing unit configured to convert a current which depends on the variable resistor of a corresponding memory cell, into a sensing voltage; a voltage control unit configured to receive the sensing voltage of a first level during an deactivation interval of a sensing control signal and provide a sensing output voltage of a second level during an activation interval of the sensing control signal; and a latch unit having latch elements for latching the sensing output voltage, wherein the sensing output voltage is regulated using a threshold voltage of the latch elements to be outputted at the second level lower than the first level.

In another embodiment of the present invention, a nonvolatile semiconductor integrated circuit comprises a memory cell array configured to include each of memory cells having a variable resistor; a current sensing unit configured to convert a current which depends on the variable resistor of a corresponding memory cell, into a sensing voltage; a voltage control unit configured to receive the sensing voltage in response to a sensing control signal and provide a sensing output voltage; and a latch unit configured to latch the sensing output voltage and provide the latched sensing output voltage as output data, wherein the current sensing unit outputs the sensing voltage of a first level, the latch unit receives the sensing output voltage of a second level lower than the first level, and the voltage control unit level-shifts the sensing voltage in response to the sensing control signal and provides the sensing output voltage of the second level.

BRIEF DESCRIPTION OF THE DRAWINGS

Features, aspects, and embodiments are described in conjunction with the attached drawings, in which.

DETAILED DESCRIPTION

Hereinafter, a nonvolatile semiconductor integrated circuit for controlling a sensing voltage according to the present invention will be described below with reference to the accompanying drawings through preferred embodiments.

Figure 1:
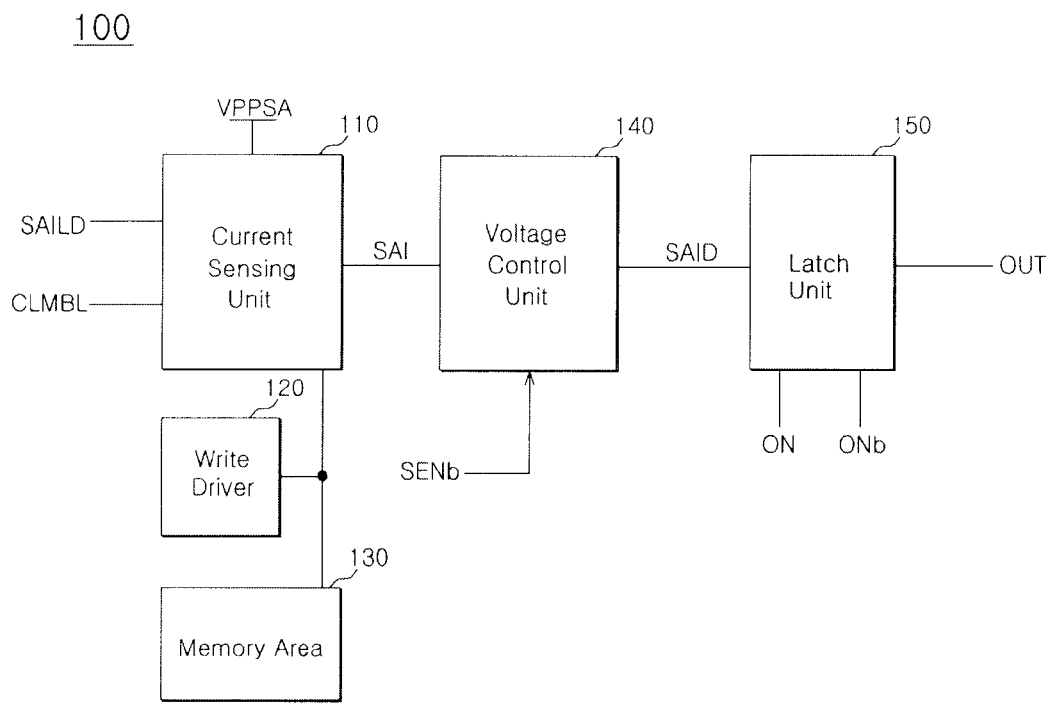
FIG. 1 is a block diagram illustrating a nonvolatile semiconductor integrated circuit according to one embodiment.
Figure 2:
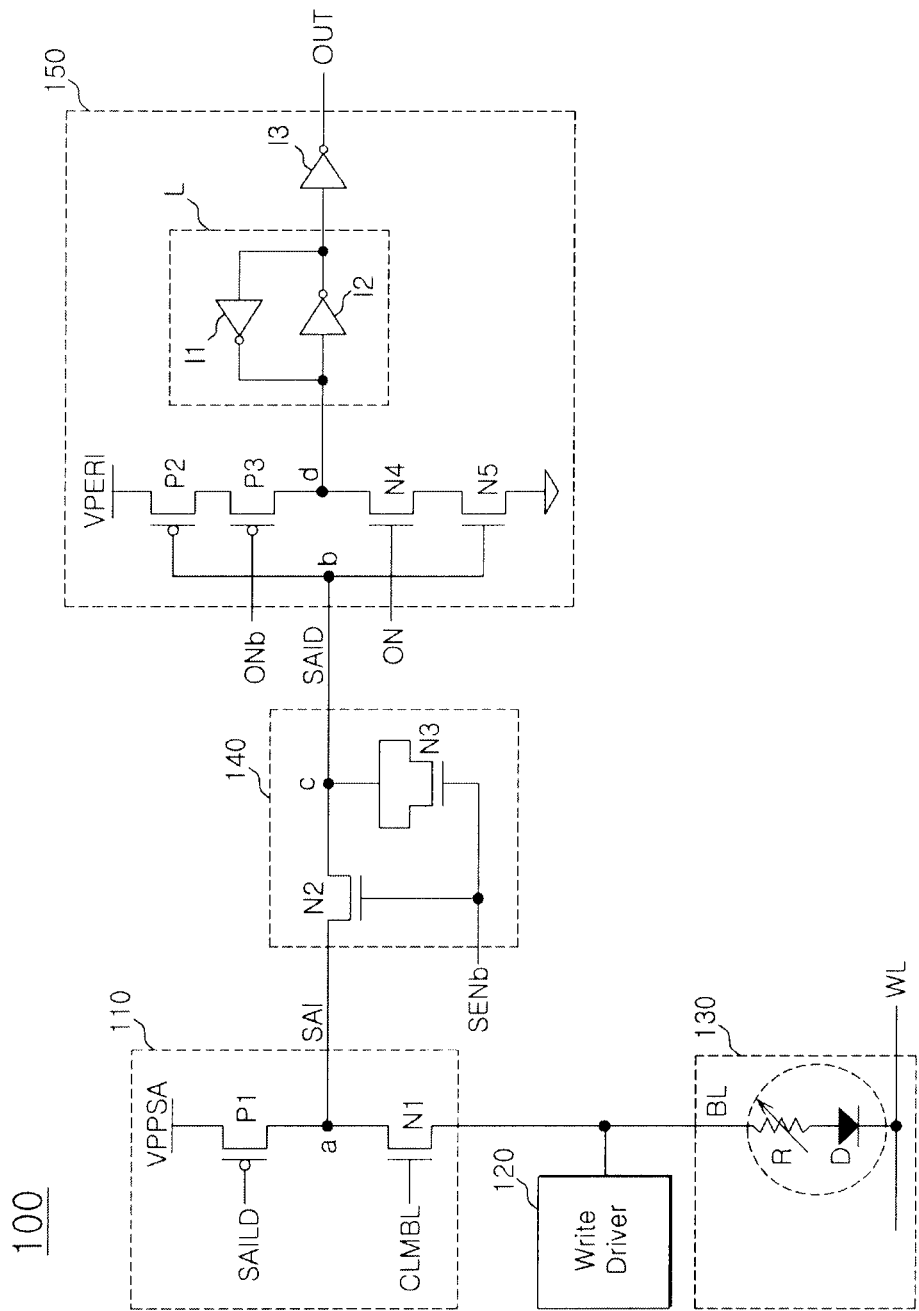
FIG. 2 is a circuit diagram of the nonvolatile semiconductor integrated circuit shown in FIG. 1.

FIG. 1 is a block diagram illustrating a nonvolatile semiconductor integrated circuit according to one embodiment, and FIG. 2 is a circuit diagram of the nonvolatile semiconductor integrated circuit shown in FIG. 1 in accordance with some embodiments.

Referring to FIGS. 1 and 2, a nonvolatile semiconductor integrated circuit 100 includes a current sensing unit 110, a write driver 120, a memory area 130, a voltage control unit 140, and a latch unit 150. The current sensing unit 110 is operatively coupled to the voltage control unit 140, the write driver 120 and the memory area 130. The voltage control unit 140 is operatively coupled to the latch unit 150. The terminology "operatively coupled" as used herein refers to coupling that enables operational and/or functional communication and relationships there-between and may include any intervening items necessary to enable such communication such as, for example, data communication buses or any other necessary intervening items that one of ordinary skill would understand to be present. Also, it is to be understood that other intervening items may be present between "operatively coupled" items even though such other intervening items are not necessary to the functional communication facilitated by the operative coupling. For example, a data communication bus may provide data to several items along a pathway along which two or more items are operatively coupled, etc. Such operative coupling is shown generally in the figures described herein. Also, the terminology "high level" and "low level" as used herein may refer to, for example, voltage levels and/or voltage ranges that are predetermined to represent the high level or low level and not necessarily any specific values. It is to be understood that "high level" and "low level" may also be referred to as "logic levels" for example, a "high logic level" and a "low logic level," respectively. Such "logic levels" may also be understood to correspond to logical or binary bit values, for example, where a "low logic level" corresponds to a logical "0" (which may correspond to an "OFF" condition) and a "high logic level" corresponds to a logical "1" (which may correspond to an "ON" condition) or vice versa depending on specific implementations in the various embodiments. For example, a transistor having a high level at its gate may be placed in an "ON" condition, (or an "OFF" condition), etc. As discussed in detail below, different sections of the semiconductor integrated circuit may have "high levels" and/or "low levels" that are different in actual potential (i.e. voltage) and the various embodiments are configured to level shift accordingly as discussed below.

The current sensing unit 110 applies a predetermined amount of current to the memory area 130 upon reading, senses a voltage which changes depending upon the resistant state of a corresponding cell, and provides a sensing voltage SAI.

The current sensing unit 110 may include a first PMOS transistor P1 and a first NMOS transistor N1 in some embodiments as illustrated in FIG. 2. FIG. 2 provides details and a circuit diagram of one exemplary embodiment implementing the nonvolatile semiconductor integrated circuit 100 illustrated in FIG. 1, however, other embodiments may utilize different arrangements and therefore it is to be understood that FIG. 2 is exemplary and to facilitate understanding by those of ordinary skill how to make and use the various embodiments but is therefore not to be construed as imposing limitations on implementation of the embodiments illustrated by FIG. 1.

The first PMOS transistor P1 supplies the predetermined amount of current to a selected bit line BL through a node 'a' of the sensing voltage SAI, which is connected to the selected bit line BL. In detail, the first PMOS transistor P1 is connected between a high voltage VPPSA and the node 'a' and receives a current driving signal SAILD through the gate thereof. The first PMOS transistor P1 is exemplified as a current driving transistor.

The first NMOS transistor N1 is connected to the node 'a' and clamps the level of the selected bit line BL to a predetermined level, for example, a level equal to or less than a threshold voltage Vth of a phase change material. The first NMOS transistor N1 is connected between the selected bit line BL and the node 'a' and receives a clamping control signal CLMBL through the gate thereof. The first NMOS transistor N1 is exemplified as a clamping transistor.

The write driver 120 buffers input data upon writing and provides the buffered input data to the memory area 130.

The memory area 130 includes a plurality of phase change random access memory (PCRAM) cells. Each of the plurality of PCRAM cells includes a switching element D which is connected to a word line WL and a variable resistor R which is connected to the bit line BL. Thus, the data of a corresponding PCRAM cell can be accessed under the control of the current sensing unit 110, and input data can be written in the corresponding PCRAM cell under the control of the write driver 120.

The voltage control unit 140 level-shifts the sensing voltage SAI in response to a sensing control signal SENb and provides a sensing output voltage SAID. In the embodiment of the present invention, differently from the conventional art in which the current sense amplifier is provided, the voltage control unit 140 includes one switching element and one coupling element such that the switching element can transmit the sensing voltage SAI of the current sensing unit 110 and the coupling element can regulate the transmitted sensing voltage SAI to a desired level.

In other words, the voltage control unit 140 transmits the level of the sensing voltage SAI to a node 'b' for a predetermined time and then interrupts the transmission of the sensing voltage SAI, and couples the level of a previously transmitted voltage with the node 'b' so that a voltage drop occurs by a specified amount.

The voltage control unit 140 includes a second NMOS transistor N2 as a switching element and a third NMOS transistor N3 as a coupling element.

The second NMOS transistor N2 includes a gate which receives the sensing control signal SENb, a source which is connected to the node 'a', and a drain which is connected to the third NMOS transistor N3. The second NMOS transistor N2 is exemplified as a switching element for transmitting a signal.

The third NMOS transistor N3 is connected to a node 'c', and includes a MOS type capacitor having a gate which receives the sensing control signal SENb and a source and a drain which are connected with each other. If the second NMOS transistor N2 is turned on in response to the sensing control signal SENb, it can transmit the sensing voltage SAI.

When the third NMOS transistor N3 operates as a capacitor in response to the deactivated sensing control signal SENb, the third NMOS transistor N3 accumulates charges corresponding to the level of the sensing voltage SAI. Then, the third NMOS transistor N3 couples the accumulated charges with the voltage of the node 'b' in response to the activated sensing control signal SENb.

For example, if the sensing voltage SAI provided from the current sensing unit 110 has a high level and the sensing control signal SENb is deactivated to a high level, a signal having the level of the sensing voltage SAI is transmitted to the node 'b' through the second NMOS transistor N2. At this time, charges accumulate in the third NMOS transistor N3. In this case, the level of the sensing output voltage SAID corresponds to a VPP level.

Thereafter, if the sensing control signal SENb is activated to a low level, the second NMOS transistor N2 is turned off, and accumulation of charges in the third NMOS transistor N3 is interrupted. By this fact, the node 'a' is in a floating state. Thus, the charges accumulated in the third NMOS transistor N3 are discharged, and the third NMOS transistor N3 and the node 'b' are coupled with each other, by which the voltage of the node 'b' drops by the predetermined amount. As a consequence, the sensing output voltage SAID, the level of which is regulated, for example, shifted to the VPERI level, can be provided to the node 'b'.

As a result, the sensing output voltage SAID can be provided by being regulated in a manner such that the sensing output voltage SAID can be outputted as a signal having a level lower than the level of the received sensing voltage SAI as the VPP level without using a separate level shifter. The potential of the sensing control signal SENb can be established based on the threshold voltage of latch elements included in the latch unit 150. Also, a coupling amount can be determined depending upon the size of the third NMOS transistor N3 so that a voltage drop speed can be regulated. Furthermore, the level of the sensing output voltage SAID can be regulated depending upon the enable pulse width of the sensing control signal SENb.

The latch unit 150 latches the sensing output signal SAID in response to a pair of output control signals ON and ONb and provides output data OUT.

The latch unit 150 includes second and third PMOS transistors P2 and P3, fourth and fifth NMOS transistors N4 and N5, a latch section L, and a third inverter I3.

The second and third PMOS transistors P2 and P3 are connected in series. The second PMOS transistor P2 has a gate which receives the sensing output signal SAID, a source which is supplied with a cell voltage VPERI, and a drain which is connected with the third PMOS transistor P3. The third PMOS transistor P3 has a gate which receives the output control signal ONb, a source which is connected with the second PMOS transistor P2, and a drain which is connected with a node 'd'.

The fourth and fifth NMOS transistors N4 and N5 are connected in series. The fourth NMOS transistor N4 has a gate which receives the output control signal ON, a drain which is connected with the node 'd', and a source which is connected with the fifth NMOS transistor N5. The fifth NMOS transistor N5 has a gate which receives the sensing output voltage SAID, a source which is connected with a ground voltage VSS, and a drain which is connected with the fourth NMOS transistor N4.

Hence, if the pair of output control signals ON and ONb are activated, the second PMOS transistor P2 is turned on or the fifth NMOS transistor N5 is turned on depending on the level of the received sensing output voltage SAID. In other words, a signal having the VPERI level can be provided to the node 'd' or a signal having the ground voltage level can be provided to the node 'd' depending on the level of the sensing output voltage SAID. The pair of output control signals ON and ONb are exemplified as signals for controlling data output signal paths.

The latch section L includes first and second inverters I1 and I2 which are connected into a latch structure.

The latch section L latches the signal of the node 'd'.

The third inverter I3 inverts the signal outputted from the latch section L and provides the inverted signal as the output data OUT.

It is to be noted that the above-mentioned circuit configuration according to the embodiment of the present invention has been given only for the purpose of illustration without a limiting sense. For example, a person having ordinary knowledge in the art can readily appreciate that a transmission gate TR may be used instead of using the single transistor as the switching element of the voltage control unit 140.

Figure 3:
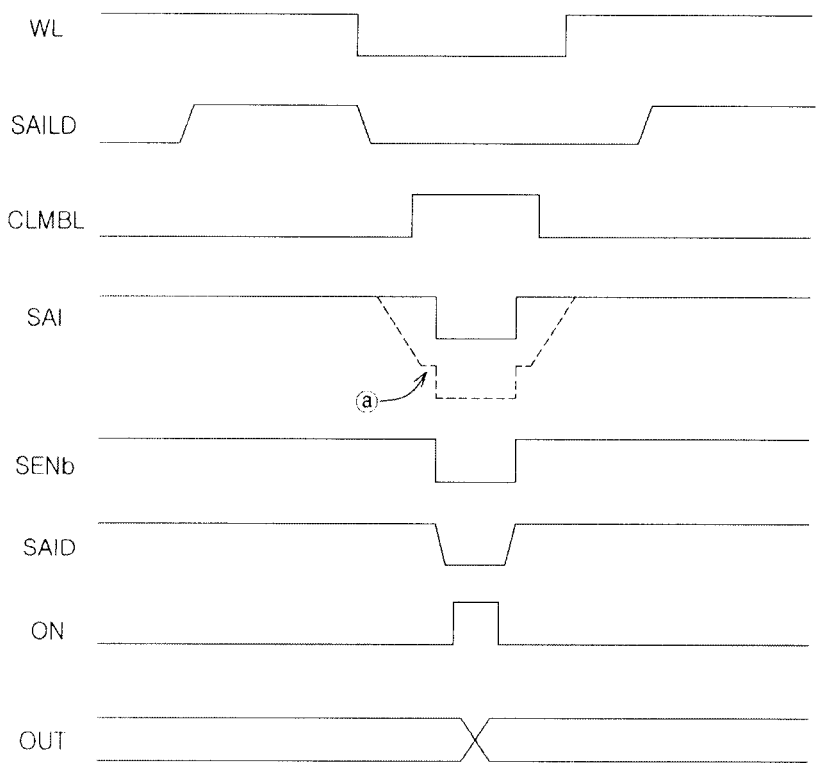
FIG. 3 is a diagram illustrating operation voltages of the nonvolatile semiconductor integrated circuit shown in FIG. 1.
Figure 4:
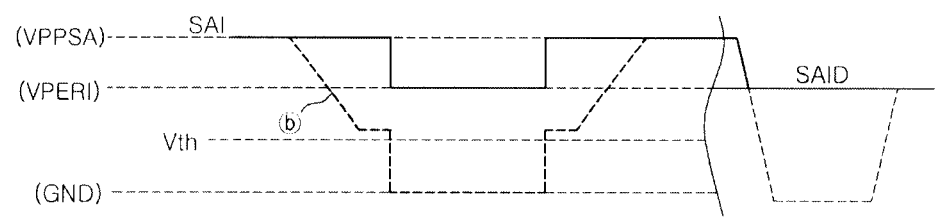
FIG. 4 is a diagram illustrating in detail the relationship between a sensing voltage and a sensing output voltage in FIG. 3.

FIGS. 3 and 4 are diagrams illustrating operation voltages of the nonvolatile semiconductor integrated circuit of FIG. 1.

First, a case in which the sensing voltage SAI has a high level will be described.

Referring to FIGS. 1 through 3, after the word line WL is activated, as the current driving signal SAILD is activated, the current sensing unit 110 implements current sensing. If the current sensing is completed, the word line WL and the current driving signal SAILD are deactivated, and then the clamping control signal CLMBL is activated.

The clamped sensing voltage SAI is transmitted to the node 'b' in response to the deactivated sensing control signal SENb. At this time, charges continuously accumulate in the third NMOS transistor N3 which serves as the MOS type capacitor.

If charges sufficiently accumulate in the third NMOS transistor N3, the sensing control signal SENb is activated to the low level.

The second NMOS transistor N2 is turned off in response to the activated sensing control signal SENb, and the charges accumulated in the third NMOS transistor N3 are coupled with the node 'b'. Thus, the voltage of the node 'b', that is, the sensing output voltage SAID, maintains the level of the sensing voltage SAT when the sensing control signal SENb is deactivated, and can be supplied at a level dropped to be lower than the sensing voltage SAT when the sensing control signal SENb is activated. As stated above, the dropped level may be the VPERI level as a level for a cell voltage. While the sensing voltage SAI and the sensing output voltage SAID are conceptually illustrated as high levels, they do not have the same potential. Also, it can be seen that, as the sensing control signal SENb is activated, the sensing voltage SAI quickly transits to a lower level (the VPERI level).

Therefore, the sensing output voltage SAID the level of which is finally regulated in response to the activated output control signal ON can be outputted as read data.

The case in which the sensing voltage SAI has the high level was described so far in detail. In terms of voltage, when it is necessary to use the output signal of the current sensing unit 110 as a high voltage domain in the latch unit 150 as a cell voltage domain, level shifting is required. That is to say, while the high level of the high voltage domain and the high level of the cell voltage domain logically belong to a high level, since a potential difference exists between the high levels of the high voltage domain and the cell voltage domain, the level shifting is required. Conversely, in the case where the sensing voltage SAI has a low level, since both the high voltage domain and the cell voltage domain have a ground voltage level, level shifting is not required.

The case in which the sensing voltage SAI has the low level as indicated by the dotted lines can be simply explained according to a similar principle.

Namely, the voltage control unit 140 continuously transmits the sensing voltage SAI, which is transiting to the low level, in response to the deactivated sensing control signal SENb, and charges accumulate in the third NMOS transistor N3 for the predetermined time. In succession, the sensing control signal SENb is activated at a time ⓐ when the sensing voltage SAI reaches the low level and is saturated.

The second NMOS transistor N2 is turned off in response to the activated sensing control signal SENb, and the charges accumulated in the third NMOS transistor N3 are coupled with the node 'b'. Accordingly, the sensing output voltage SAID can be supplied as the low level of the ground voltage. In the case where the sensing voltage SAI has the low level, a down-shifting time or slope can be regulated.

Considering the relationship between the actual levels of the sensing voltage SAI and the sensing output voltage SAID, they have different potential levels as shown in FIG. 4.

In an initial transmission stage of the sensing voltage SAI, that is, when the sensing control signal SENb is deactivated, the sensing voltage SAI is maintained at a level corresponding to the high voltage (VPP) level provided from the current sensing unit 110. Then, if the sensing control signal SENb is activated, the sensing voltage SAI is provided at the level that corresponds to the VPERI level lower than the initial level of the sensing voltage SAT. That is to say, if the sensing control signal SENb is deactivated, the sensing output voltage SAID has the VPP level, but if the sensing control signal SENb is activated, the sensing output voltage SAID has the VPERI level. Actually, the sensing output voltage SAID of the VPERI level can be used at a time when the pair of output control signals ON and ONb are activated (see FIG. 3).

A level ⓑ indicated by the dotted lines as shown in FIG. 4 represents the case in which the sensing voltage SAI has the low level. This conceptually means that coupling occurs at a time when the low level data is saturated.

As is apparent from the above description, in the nonvolatile semiconductor integrated circuit according to the embodiment of the present invention, a sensing voltage (SAI) having a high voltage level can be dropped using a switching element and a coupling element without using a level shifter. Consequently, a finally regulated sensing output voltage (SAID) of a VPERI level as a level for a cell voltage can be provided.

While certain embodiments have been described above, it will be understood to those skilled in the art that the embodiments described are by way of example only. Accordingly, the nonvolatile semiconductor integrated circuit for controlling a sensing voltage described herein should not be limited based on the described embodiments. Rather, the nonvolatile semiconductor integrated circuit for controlling a sensing voltage described herein should only be limited in light of the claims that follow when taken in conjunction with the above description and accompanying drawings.

What is claimed is:

1. A nonvolatile semiconductor integrated circuit comprising:
   a memory cell array configured to include each of memory cells having a variable resistor;
   a current sensing unit, operatively coupled to the memory cell array, configured to convert a current which depends on the variable resistor of a corresponding memory cell, into a sensing voltage;
   a voltage control unit, operatively coupled to the current sensing unit, configured to receive the sensing voltage of a first level during an deactivation interval of a sensing control signal and provide a sensing output voltage of a second level during an activation interval of the sensing control signal; and
   a latch unit, operatively coupled to the voltage control unit, having latch elements for latching the sensing output voltage,
   wherein the sensing output voltage is regulated using a threshold voltage of the latch elements to be outputted at the second level lower than the first level.

2. The nonvolatile semiconductor integrated circuit according to claim 1, wherein the voltage control unit comprises:
   a switching element configured to transmit the sensing voltage in response to the sensing control signal; and
   a capacitor connected to the switching element and configured to accumulate charges corresponding to the sensing voltage in response to the sensing control signal.

3. The nonvolatile semiconductor integrated circuit according to claim 2, wherein the switching element transmits the sensing voltage when the sensing control signal is deactivated and intercepts the sensing voltage when the sensing control signal is activated.

4. The nonvolatile semiconductor integrated circuit according to claim 2, wherein the capacitor operates as a charge accumulating element when the sensing control signal is deactivated and operates as a coupling element when the sensing control signal is activated, to be coupled with a node of the sensing output voltage and regulate the sensing output voltage by a predetermined amount.

5. The nonvolatile semiconductor integrated circuit according to claim 4, wherein the voltage control unit maintains the sensing output voltage at a level of the initially received sensing voltage when the sensing control signal is deactivated and outputs the sensing output voltage at a level lower than the level of the initially received sensing voltage when the sensing control signal is activated.

6. The nonvolatile semiconductor integrated circuit according to claim 1, wherein a level of the sensing output voltage is regulated by tuning a pulse width of the sensing control signal.

7. The nonvolatile semiconductor integrated circuit according to claim 2, wherein a voltage regulation speed of the sensing output voltage is tuned by changing a size of the capacitor.

8. A nonvolatile semiconductor integrated circuit comprising:
   a memory cell array configured to include each of memory cells having a variable resistor;
   a current sensing unit, operatively coupled to the memory cell array, configured to convert a current which depends on the variable resistor of a corresponding memory cell, into a sensing voltage;
   a voltage control unit, operatively coupled to the current sensing unit, configured to receive the sensing voltage in response to a sensing control signal and provide a sensing output voltage; and
   a latch unit, operatively coupled to the voltage control unit, configured to latch the sensing output voltage and provide the latched sensing output voltage as output data,
   wherein the current sensing unit outputs the sensing voltage of a first level, the latch unit receives the sensing output voltage of a second level lower than the first level, and the voltage control unit level-shifts the sensing voltage in response to the sensing control signal and provides the sensing output voltage of the second level.

9. The nonvolatile semiconductor integrated circuit according to claim 8, wherein the voltage control unit provides the sensing output voltage at the first level when the sensing control signal is deactivated and provides the sensing output voltage at the second level when the sensing control signal is activated.

10. The nonvolatile semiconductor integrated circuit according to claim 8, wherein the voltage control unit comprises:
    a switching element configured to transmit the sensing voltage in response to the sensing control signal; and
    a capacitor connected to the switching element and configured to accumulate charges corresponding to the sensing voltage in response to the sensing control signal.

11. The nonvolatile semiconductor integrated circuit according to claim 10, wherein the switching element transmits the sensing voltage when the sensing control signal is deactivated and intercepts the sensing voltage when the sensing control signal is activated.

12. The nonvolatile semiconductor integrated circuit according to claim 10, wherein the capacitor operates as a charge accumulating element when the sensing control signal is deactivated and operates as a coupling element when the sensing control signal is activated, to be coupled with a node of the sensing output voltage and level-shift the sensing output voltage.

* * * * *